United States Patent
Sarchi et al.

(10) Patent No.: US 10,139,433 B2
(45) Date of Patent: Nov. 27, 2018

(54) METHOD OF MEASURING CURRENT DISTRIBUTION IN HIGH AND MEDIUM VOLTAGE CABLES

(71) Applicant: PRYSMIAN S.P.A., Milan (IT)

(72) Inventors: Davide Sarchi, Milan (IT); Luca Palmieri, Selvazzano Dentro (IT)

(73) Assignee: PRYSMIAN S.P.A., Milan (IT)

( * ) Notice: Subject to any disclaimer, the term of this patent is extended or adjusted under 35 U.S.C. 154(b) by 249 days.

(21) Appl. No.: 15/128,328

(22) PCT Filed: Mar. 24, 2014

(86) PCT No.: PCT/EP2014/055844
§ 371 (c)(1),
(2) Date: Sep. 22, 2016

(87) PCT Pub. No.: WO2015/144199
PCT Pub. Date: Oct. 1, 2015

(65) Prior Publication Data
US 2017/0102415 A1      Apr. 13, 2017

(51) Int. Cl.
*G01R 13/38*    (2006.01)
*G01R 15/24*    (2006.01)

(52) U.S. Cl.
CPC .................. *G01R 15/246* (2013.01)

(58) Field of Classification Search
CPC .................................................. G01R 15/246
See application file for complete search history.

(56) References Cited

U.S. PATENT DOCUMENTS 3,597,683 A  *  8/1971  Saito ................... G01R 15/246
                                                                324/631
4,580,234 A       4/1986  Fujitani
(Continued)

FOREIGN PATENT DOCUMENTS

CN         102005265          4/2011
DE         36 15 557         11/1987
(Continued)

OTHER PUBLICATIONS

Rogers; "Distributed Optical-Fibre Sensors", Journal of Physics D: Applied Physics, Institute of Physics Publishing Ltd., GB, vol. 19, No. 12, pp. 2237-2255, (1986).
(Continued)

*Primary Examiner* — Tung X Nguyen
*Assistant Examiner* — Dominic Hawkins
(74) *Attorney, Agent, or Firm* — Finnegan, Henderson, Farabow, Garrett & Dunner, L.L.P.

(57) ABSTRACT

A method for detecting an electrical current longitudinal variation in a power transmission system including a power cable. Electric losses and their location along the cable length can be detected. Current variation in a grounded metallic layer of a power cable is measured from Faraday rotation of polarised light travelling in a single-mode optical fiber wound in a radially external position with respect to the grounded metallic layer. Measurements of the Faraday rotation are carried out by means of polarization-sensitive optical time domain reflectometry (POTDR) or by polarization-sensitive optical frequency domain reflectometry (POFDR) while a direct current is injected in the metallic layer.

15 Claims, 6 Drawing Sheets

(56) References Cited

U.S. PATENT DOCUMENTS

| | | | | |
|---|---|---|---|---|
| 5,365,175 | A | 11/1994 | Patterson et al. | |
| 6,741,081 | B1 * | 5/2004 | Eslambolchi | H04B 10/07 324/509 |
| 7,808,249 | B1 * | 10/2010 | Lo | H04L 43/50 324/534 |
| 2002/0186938 | A1 | 12/2002 | Stottlemyer | |
| 2004/0011551 | A1 | 1/2004 | Goehlich et al. | |
| 2008/0226218 | A1 * | 9/2008 | Abe | G01L 1/243 385/13 |
| 2011/0218790 | A1 * | 9/2011 | Algaonkar | G01K 11/32 703/13 |
| 2012/0174683 | A1 * | 7/2012 | Kemnitz | G01L 1/242 73/800 |
| 2014/0049786 | A1 * | 2/2014 | Knuepfer | G01B 11/02 356/634 |

FOREIGN PATENT DOCUMENTS

| | | |
|---|---|---|
| EP | 0 584 447 | 3/1994 |
| WO | WO 02/095349 | 11/2002 |

OTHER PUBLICATIONS

Rogers; "Optical Measurement of Current and Voltage on Power Systems", IEE Journal on Electric Power Applications, vol. 2, No. 4, pp. 120-124, (1979).

Wuilpart et al.; "Measurement of Magnetic Field Using Rayleigh Backscattering in Optical Fibres", Advancements in Nuclear Instrumentation Measurement Methods and Their Applications (ANIMMA), pp. 1-6, (2011).

Palmieri et al.; "Distributed Polarization-Sensitive Reflectometry in Nonreciprocal Single-Mode Optical Fibers", Journal of Lightwave Technology, vol. 29, No. 21, pp. 3178-3184, (2011).

Tziouvaras; "Protection of High-Voltage AC Cables",Power Systems Conference, PSC, pp. 1-14, (2006).

International Search Report from the European Patent Office for International Application No. PCT/EP2014/055844, dated Dec. 23, 2014.

* cited by examiner

METHOD OF MEASURING CURRENT DISTRIBUTION IN HIGH AND MEDIUM VOLTAGE CABLES

CROSS REFERENCE TO RELATED APPLICATION

This application is a national phase application based on PCT/EP2014/055844, filed Mar. 24, 2014, the content of which is incorporated herein by reference.

FIELD OF THE INVENTION

The present invention is directed to a method for detecting a damage in a power transmission cable, which causes a current loss in the cable.

The present invention relates also to method for detecting electrical current variation in a power transmission system.

RELATED ART

High-voltage power systems are used for transmission in alternating current (AC) grid networks, for example for direct connections between two (existing) meshed systems. Medium- and high-voltage direct current (DC) transmission lines are mainly employed for asynchronous submarine and land transmission of very long-distances (i.e. more than 50 km) since they can transport high power loads with very low losses.

Underground high voltage electricity transmission is carried out by power cables which are generally either buried or laid in ducts. High-voltage cables are typically single-core and they are installed in trenches or ducts, typically in groups of three as required for a three phase transmission system.

High voltage (HV) cables are typically provided with a metallic screen and/or a metallic sheath enclosing the electrically insulated metal cores carrying the electricity. An outer layer, often referred to as jacket, surrounds and mechanically protects the metallic sheath and the inner layers of the cable. The metallic sheath is provided to prevent moisture or chemicals from penetrating the cable insulation layers surrounding the cores. The metallic screen disperses earth fault currents. Both the metallic sheath and screens can be typically connected to the ground to drain the short circuit current.

Electric cables can be mechanically damaged, for example due to mishandling during installation. If the damage affects the cable jacket only, it may remain undetected as it does not affect the electrical function of the cable. However, water can penetrate through the damaged portion of the jacket into the metallic sheath, thereby causing a current loss to ground at the damage location.

Accordingly, it is important to detect and localize the damage position along the cable in order to repair the faulty section of the transmission system.

US 2004/0011551 describes a three-phase high voltage cable arrangement for transmitting power, in which cables are equipped with electric water sensors to detect the intrusion of water into the screen. An electric method is used in which a DC voltage is applied between the water sensor and the cable screen and a current flow is generated between the cable screen and the water sensor if there is a water intrusion. Furthermore, the system can measure DC currents between a water sensing wire and the screen of an adjacent cable in order to provide various measurement values for the water intrusion.

Measurement of the intensity of an electric current by using an optical fibre wound around a current path as a sensor is generally known (see for example U.S. Pat. No. 5,365,175). Optical fibre sensors use the Faraday effect, whereby the magnetic field generated by the electric current induces a rotation of the plane of polarisation, called Faraday rotation, of the light travelling through the fibre. This rotation, per unit length, is proportional to the variation of the intensity of the component of the magnetic field along the light propagation path (the optical fibre). Therefore, it is possible to derive the variation of the current intensity from the variation of the intensity of the magnetic field.

The angle of rotation θ of the polarisation plane is related to the line integral of the magnetic field B along the light propagation path, dz, by the relation:

$$\theta = V \int B(z) dz, \tag{1}$$

where V is the Verdet constant of the fibre material. If the magnetic field is induced by an electric current, I, Eq. (1) can be expressed as:

$$\theta = N \cdot V \cdot I \tag{2}$$

where N is the number of windings of the fibre and I is the current intensity.

A method for detecting and locating current imbalances, such as ground faults, in a multi-wire power system by using the Faraday effect is described in U.S. Pat. No. 5,365,175. A plurality of circular optical paths, each for transmission of light having a linear state of polarization, are provided, wherein at least one pair of current carrying conductors including a forward and return path for current are placed within at least two of circular optical paths, the rotation in the linear state of polarization is detected in the at least two optical paths, thereby signalling a ground fault and locating said ground fault by comparing detected rotations in said at least two optical paths.

DE 3615557 relates to a device for measuring current using the Faraday effect. A first optical fibre is arranged in the wire bundle forming the conductive core of the cable and extends along the cable length. The first fibre is connected at the cable ends with components of the measurement device. A second optical fibre is arranged either on the insulation layer under or in the screen, with a laying direction opposite to that of the first fibre. Also the second fibre is connected to a measuring device. The cable length is divided in two equal sections and, at the position of the division, first and second fibres are placed in shunt so that only in case of a fault a rotation of light polarization is set and can be used for disconnecting the faulty current, i.e. differentiation.

EP0584447 concerns a current sensing arrangement for a run of energy core of a power cable supplied from one end, having at least two polarisation-maintaining optical waveguides, which are developed as Faraday coils and having, at one end of the run, devices for injecting and decoupling light and a device for analysing optical signals. In one power line, a combination is provided of a concentrated and a distributed optical waveguide coil, both of which are individually controlled externally, where their measured values are analysed. The concentrated current sensor is a tightly wound optical waveguide coil and the distributed current sensor is an optical waveguide coil that has a long lay.

Fault location in a power cable based on the optical detection of the mechanical damage in a optical fibre has been also employed.

CN102005265 discloses a power cable capable of detecting a fault position. The cable is a cross-linking polyethylene insulating power cable provided with a plurality of single-mode optical fibres attached to the metallic shielding layer. When a short circuit takes place, the optical fibre is damaged and then forms a reflection point for the light so that it is possible to detect the position of the fault.

Polarisation-sensitive reflectometry (PSR) is a technique for characterizing the local polarisation properties of single-mode optical fibres. Reflectometry can be performed in time domain or in frequency domain.

L. Palmieri and A. Galtarossa in "*Distributed Polarization-Sensitive Reflectometry in Nonreciprocal Single-Mode Optical Fibers*", Journal of Lightwave Technology, vol. 29 (2011), no. 21, pp. 3178-3184, present a theoretical model and a preliminary experimental application of distributed PSR measurement in single-mode fibre affected by nonreciprocal birefringence. Reciprocity allows relating the properties of the fibre when traversed in a direction to the properties of the same fibre when traversed in opposite direction. The authors observed that Faraday rotation is a well-known nonreciprocal magneto-optical effect and that it causes nonreciprocal circular birefringence. Therefore, in the general case, the optical fibre is affected by both reciprocal birefringence and Faraday nonreciprocal rotation. The Faraday induced circular birefringence, with respect to forward propagation, is given by $$\eta(z) = 2V \cdot B(z) \cdot \cos \psi(z) \quad (3)$$

where V is the Verdet constant, B(z) is the amplitude of the magnetic induction (possibly varying along the fibre) and $\psi(z)$ is the angle subtended by the direction of the magnetic induction and the forward propagation of light. Faraday rotation causes the same rotation of the state of polarisation (SOP), independently of the propagation direction. The described theory was verified by the authors by experimental measurements using a polarisation-sensitive optical frequency domain reflectometer on a single-mode fibre arranged on a plastic tube and placed in a patient bore of a MRI scanner at 1.5 Tesla.

The Applicant faced the problem of detecting and localizing the location of damage possibly occurred in a medium voltage (MV) or high voltage (HV) cable network.

SUMMARY OF THE INVENTION

The Applicant perceived that longitudinal variation of the magnetic field due to the longitudinal variation of the current circulating in a cable could provide information about a possible injury to the cable structure. The Applicant found that such variation can be measured in a grounded metallic layer of a power cable by polarisation-sensitive optical reflectometry (PSR) and that this measurement can provide information about the location of significant electrical losses along a cable length. In particular, a single-mode optical fibre can supply the desired information when positioned around the cable core in a radially external position with respect to a grounded metallic layer. PSR techniques include polarisation optical time domain reflectometry (POTDR) and polarisation optical frequency domain reflectometry (POFDR).

The PSR readings of a single-mode optical fibre positioned in a MV or HV cable over a metallic layer in which current circulates can provide information about electric losses even when such losses are relatively low, for example 100 A. Measurement is based on the magnetic field induced by a current circulating in a power cable metallic layer other than the conductor, wherein the current can be either induced by the transmitted power in an operating AC cable or independently injected in the metallic layer.

The present invention relates to a method for detecting an electrical current longitudinal variation in a power transmission system comprising a power cable, in particular for detection and localisation of a cable fault, the method comprising:

providing a grounded power cable having a longitudinal axis and extending between first and second cable ends for a cable length, and comprising an insulated conductor, a metallic layer radially external to the insulated conductor, and an optical fibre sensor longitudinally extending at least between the cable ends, said sensor comprising a single-mode optical fibre wound about the longitudinal axis in a radially external position with respect to the metallic layer;

circulating an electric current in the metallic layer along the cable length, inducing a magnetic field;

injecting into a first end of the single-mode optical fibre a probe optical signal polarised in an input polarisation state;

detecting a backscattered optical signal corresponding to the injected probe optical signal by polarisation-sensitive optical reflectometry;

analysing the backscattered optical signal to determine a longitudinal evolution of the rotation angle of the polarisation state;

calculating, from the longitudinal evolution of the rotation angle, a longitudinal variation in the magnetic field in the cable so as to determine a trace of electric current inducing said magnetic field as a function of the longitudinal position of the cable length, and analysing the current trace to detect the presence of a longitudinal variation in the electric current and a longitudinal position between the cable ends at which the variation occurs to detect a cable fault localised at said longitudinal position.

Preferably, the single-mode optical fibre is wound about the longitudinal cable axis so that a direction of propagation of light travelling in the fibre is substantially in the direction of a non-null component of a magnetic field induced in the cable when a current circulates in the metallic layer.

Preferably, the optical fibre of the sensor is wound about the longitudinal axis in a single winding direction.

Advantageously, the optical fibre of the sensor is wound about the longitudinal axis with a constant pitch, preferably of from 10 cm to 50 cm.

Advantageously, circulating an electric current in the metallic layer comprises supplying an electric direct current (DC) in the metallic layer thus inducing a magnetic field therein. Preferably, the provided direct current has an intensity value of from 100 A to 700 A.

Preferably, the direct current is provided by electrically connecting a first pole of a DC generator to the cable metallic layer.

In an embodiment, circulating an electric current in the metallic layer comprises supplying an electric current by means of a DC generator having a first pole electrically connected to the cable metallic layer and a second pole connected to ground. In this embodiment, preferably, the power cable is grounded during PSR measurements.

The cable is a high-voltage or a medium voltage cable, preferably a single-core cable. Preferably, the metallic layer is a metallic screen (a.k.a. metallic shield).

Preferably, in the method of the invention injecting and detecting comprise injecting a plurality of probe optical signals having distinct input polarisation states and detecting a corresponding plurality of backscattered optical signals, and analysing comprises analysing the plurality of backscattered optical signals to determine a longitudinal evolution of the rotation angle of the polarisation state.

In the method according to the invention the cable can be a first power cable of a three-phase transmission system in alternating current with a first metallic layer, the transmission system further comprising a second and a third power cable comprising each an insulated core and a respective second and third metallic layer radially external to the insulated core, the method further comprising:

establishing an electric circuit by electrically connecting first and second metallic layer one to another at a respective first end of the first and second metallic layer and by connecting the second metallic layer to a direct current generator at a respective second end of the second metallic layer opposite to the first end, wherein circulating an electric current in the metallic layer comprises causing the generator to supply an electric direct current in the first and second metallic layer whereby a magnetic field is induced.

Preferably, the transmission system has a cross-bonding configuration having first, second and third transmission line, each line being divided into three sections and the metallic layers of the phases being connected in couples at each section and grounded at both ends of each transmission line, wherein the first cable is a section of the first transmission line and the second cable is a section of the second transmission line. Preferably, before establishing an electric circuit by connecting first and second metallic layer one to another and to the direct current generator, the method comprises disconnecting the first and second power cable from ground.

During operation (i.e. power transmission), the power cable is grounded by connecting a cable metallic layer to ground (earth) through one or more ground conductors establishing a path for the current flow to the earth. In a three-phase transmission system, during operation, the metallic layer of each power cable is grounded by one or more ground conductors.

Optionally, the method of the invention comprises disconnecting ground conductors from earth before circulating the electric current in the metallic layer along the cable length inducing a magnetic field.

In case of a damage occurring in the cable jacket, water or moisture, which comes from the underground environment where the cable is deployed and/or from a wet-weather event, can intrude in the cable and create a path for the current flow to earth. Water intrusion through the cable jacket damage can give place to an unintentional grounding of the cable causing a current loss.

Within the present description and claims, as insulated conductor it is meant a cable element comprising a metallic electric conductor surrounded, sequentially, by a first semiconducting layer, an electrically insulating layer and a second semiconducting layer.

In some embodiments, circulating an electric current in the metallic layer comprises injecting an electric direct current in the metallic layer to induce a magnetic field therein. Preferably, injecting a direct current is carried out by electrically connecting a first pole of a DC generator to the cable metallic layer. In the case the detection is carried out on two cables at the same time, the first pole of a DC generator is connected to the metallic layer of one cable and a second pole of a DC generator is connected to the metallic layer of the other cable.

In an embodiment, the metallic layer can be a metallic screen (or shield) and/or a metallic sheath. In a cable of the invention a metallic sheath can be positioned radially external to a metallic screen.

The optical fibre sensor can be positioned in contact with the metallic screen or with the metallic sheath, or can be embedded in or superposed to a layer radially external to the metallic screen and/or the metallic sheath, for example into or above a cable jacket.

The power cable further comprises a jacket arranged radially external to the metallic layer. Preferably, the jacket is an outer layer made of polymeric material.

In some embodiments, the steps of injecting a probe optical signal and detecting a backscattered optical signal are iterated at least once, by changing at each iteration the input state of polarisation of the probe optical signal, and analysing is inspecting a plurality of backscattered optical signals to determine the longitudinal evolution of the Faraday rotation.

In particular, injecting into the single-mode optical fibre a probe optical signal comprises injecting at least two probe optical signals polarised having distinct states of polarisation (SOPs), detecting comprises detecting a corresponding at least two backscattered optical signals, and analysing comprises inspecting the at least two backscattered optical signals to determine a longitudinal evolution of the rotation angle of the polarisation state of each injected signal. Advantageously, the injected probe optical signals are at least three.

By referring to the winding of the sensing optical fibre being such that the direction of propagation of light along the sensing fibre is substantially in the direction of a non-null component of the magnetic field in the cable, it is meant that the sensing optical fibre is wound substantially parallel to such component as much as allowed by the acceptable manufacturing practice. For example, if the magnetic component is perpendicular to the longitudinal axis of the cable, the optical fibre will be wound as parallel as possible to this component, preferably with a winding pitch from $\frac{1}{10}$ to $\frac{1}{15}$ of the cable diameter.

Preferably, the optical fibre sensor is wound about the longitudinal axis with constant pitch and along a single winding longitudinal direction.

In some embodiments, the optical fibre sensor is wound about the longitudinal axis with a winding pitch of from 10 cm to 50 cm.

The steps of the present method other than the one of providing a grounded cable can be repeated by changing the intensity of current injected and inverting the direction of light measurement (by connecting the far end of the optical fibre to a returning fibre of a parallel cable and taking the measurement from that cable). This is advantageous for discerning the variation of the evolution of the rotation angle due to a variation of the magnetic field from possible "background noise" due to parameters, such as temperature variation and mechanical stress, capable of affecting the polarization state of a probe optical signal.

Preferably, the optical fibre sensor comprises a single mode optical fibre according to ITU-T G.652 (2005) with low birefringence.

BRIEF DESCRIPTION OF THE DRAWINGS

The present invention will be now described more fully hereinafter with reference to the accompanying drawings, in which some, but not all embodiments of the invention are shown. Drawings illustrating the embodiments are not-to-scale schematic representations.

For the purpose of the present description and of the appended claims, except where otherwise indicated, all numbers expressing amounts, quantities, percentages, and so forth, are to be understood as being modified in all instances by the term "about". Also, all ranges include the maximum and minimum points disclosed and include any intermediate ranges therein, which may or may not be specifically enumerated therein.

DETAILED DESCRIPTION

Figure 1:
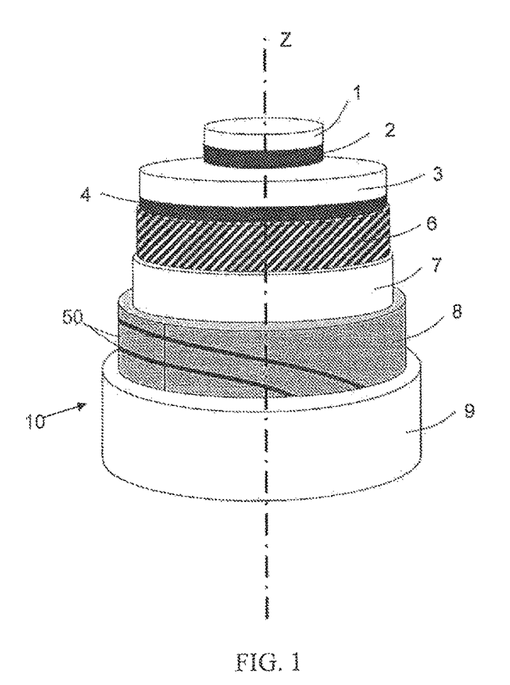
FIG. 1 is a schematic perspective view of a single-core power cable of a three-phase group for underground AC high-voltage transmission systems, in accordance with an embodiment consistent with the present disclosure.

FIG. 1 is a schematic perspective view of a single-core power cable of a three-phase system for underground high-voltage transmission systems in alternating current (AC), in accordance with an embodiment consistent with the present disclosure. A cable 10, extending along a longitudinal axis Z, comprises an insulated conductor comprising: a metallic conductor 1, for example a copper conductor formed by a bundle of tinned or bare copper electrical wires stranded together according to conventional methods, an inner semiconductive layer 2 arranged radially external to the conductor, an electrically insulating layer 3 and an outer semiconductive layer 4. Insulating and semiconductive layers 2-4 of the insulated core are, for example, made of cross-linked polyethylene (XLPE) added, in the case of the semiconductive layers 2 and 4, with a conductive filler, e.g. carbon black. The cable further comprises the following elements arranged sequentially in a position radially external to the insulated conductor: a metallic screen 6 made of metallic wire; a separation tape 7, made of a water-swelling semiconductive material; a metallic sheath 8 in form of a longitudinally welded aluminium foil, and a jacket 9 made of polymeric material, for example high density polyethylene (HDPE). A further separation tape, not illustrated, can be provided between outer semiconductive layer 4 and metallic screen 6. In cable 10, the metallic screen 6 and the metallic sheath 8 are metallic layers arranged radially external to the insulated conductor.

An optical fibre sensor 50 comprising a single-mode optical fibre 51 (detailed in FIG. 1A) is wound onto the metallic sheath 8 about the longitudinal axis along the cable length, in direct contact with the outer surface of the sheath 8, in the case of FIG. 1. Winding of the optical fibre is such that a vector tangent to the wound optical fibre has at least one component parallel to the magnetic field vector $\overline{B}$ generated when an electric current circulates in the metallic sheath. Being the optical fibre sensor placed on a metallic foil, winding can be clockwise or counter-clockwise.

Preferably winding has a constant pitch and a single longitudinal winding direction. A constant pitch and direction of the optical fibre winding eases the localization of the electric loss along the cable because the effect of the induced magnetic field onto the fibre polarization is constant and therefore more clearly readable.

Figure 1A:
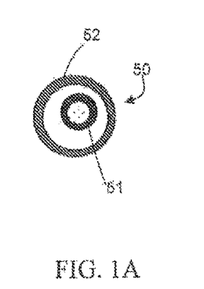
FIG. 1A is a schematic plan view of the fibre optic sensor of the cable of FIG. 1A.

The optical fibre sensor 50 further comprises a longitudinally extending tube 52 in which the optical fibre 51 is inserted in a loose or semi-loose configuration (FIG. 1A). Such configuration provides for an excess fibre length relative to the tube length to compensate the expected maximum elongation of the cable (and of the fibre housing tube), so that no significant strain is transferred to the optical fibre. Although some embodiments may envisage a tight buffer configuration, this configuration may give rise to unwanted increase of birefringence in the optical fibre. The loose buffer tube is preferably made of a dielectric material, for example of a flexible polymer that withstands compression, such as glass-reinforced polymer (GRP).

A relatively short winding pitch for the winding of the fibre in the longitudinal direction Z is advantageous for obtaining a finer resolution of the optical fibre reading. For example the pitch can be of 100 cm or less, more preferably of 50 cm or less, for example down to 10 cm. In general, the shorter the winding pitch is, the more accurate the reading. However, a very short pitch is often more complex and expensive from a manufacturing point of view, and thus the skilled person may select a convenient low pitch in view of her/his manufacturing provisions.

After laying of the optical fibre sensor 50 for current sensing, the polymeric jacket 9 can be extruded onto the metallic sheath 8 and the dielectric tube 52.

Preferably, the single-mode optical fibre 51 is a low birefringence optical fibre. In some embodiments, the single-mode optical fibre 51 is a transmission optical fibre made of silica coated, in the usual ways, by a coating system.

In the embodiment shown in FIG. 1, the metallic screen 6 is made of a wound metallic wire wrapped around the underlying semiconductive layer, while a laminated foil, longitudinally folded around the insulated conductor, is used as metallic sheath 8. Typically, the laminated foil is made of a polymeric layer and a metal layer radially external thereof and with overlapping longitudinal edges fastened by polymeric adhesive resin. Single-core HV power cables may have different construction from that shown in FIG. 1. In particular, the metallic screen 6 can have different configurations. For example, the screen can be made of a metallic wire wound on the underlying cable layers and of a metallic equalising tape wound in the opposite direction to that of the metallic wire. In another configuration, the screen can be formed by a wire woven into a braid, i.e. a metallic braid, applied onto the underlying layers. The metal used for the tapes or wires of the screen is typically aluminium or copper or composite thereof.

Screen wire braiding or windings are possibly encircled by a metallic or metallic/polymeric layer suitable to prevent the intrusion of water into the radially underlying layers of the cable.

In an embodiment (not shown FIG. 1), an HV power cable can comprise a metallic armour external to the metallic sheath 8 and, generally, to the jacket 9, and separated therefrom by one or more protecting tapes. The armour can be typically composed of metallic wires, for example steel wires, wound around the longitudinal cable axis. In an armoured cable and according to an embodiment, the loosely or semi-loosely buffered optical fibre of the optical fibre sensor can be embedded in a modified wire of the armour to be laid parallel to the armouring elements. Different methods are available to embed optical fibres in the armour, such as, for example, those described in US 2002/186938.

In still another embodiment and with reference to FIG. 1, the optical fibre 51, which is buffered in a loose or semi-loose configuration in the sensor 50, is positioned under the metallic sheath 8 and in contact with the semiconductive separation tape 7, wherein the optical fibre sensor is wound about the longitudinal axis of the cable. In this construction, the optical fibre sensor is arranged radially external to the metallic screen 6. Winding is such that a vector tangent to the wound optical fibre has at least one component parallel to the magnetic field vector $\overline{B}$ generated when an electric current is circulated in the metallic screen. As described more in detail in the following, when the metallic screen is made of wound metallic wire or tape, the optical fibre sensor is preferably wound with a winding direction opposite to that of the metallic screen.

In a still further embodiment (not shown FIG. 1), the optical fibre 51, which is buffered in a loose or semi-loose configuration in the sensor 50, can be wound in a radial external position with respect to jacket 9 or, preferably, can be embedded in the jacket 9. In both said configurations, the optical fibre sensor is wound in a configuration analogous to that described with reference to FIG. 1.

Figure 2:
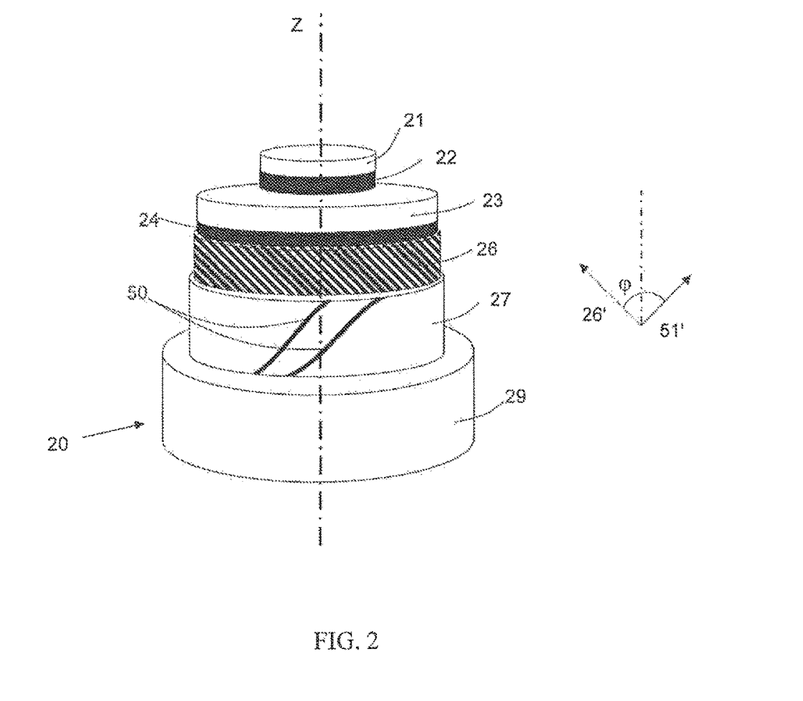
FIG. 2 is a schematic perspective view of a single-core power cable of a three-phase group for underground AC medium-voltage transmission systems, in accordance with an embodiment consistent with the present disclosure.

FIG. 2 shows a single-core medium-voltage (MV) cable designs. In particular, FIG. 2 shows a MV single-core cable that may constitute a phase of a three-phase cable group for AC power transmission, in accordance with an embodiment consistent with the present disclosure. The cable 20, extending along a longitudinal cable axis Z, comprises an insulated conductor comprising an electrical conductor 21 in form of a bundle of, for example, Al or Cu stranded wires, and the following layers sequentially provided around the conductor 21: an inner semiconductive layer 22; an insulation layer 23, e.g. ethylene-propylene-rubber (EPR) insulation, and an outer semiconductive layer 24. Radially external to the insulated conductor the following layers are sequentially provided: a metallic screen 26 made of metallic wires wounded about the longitudinal cable axis; a protective polyester tape 27, and a jacket 29 made, for example, of a polyethylene/polyvinyl chloride mixture.

The cable 20 is provided with an optical fibre sensor 50, which is wound onto the protective polyester tape 27, radially external to the metallic screen 26.

It is to be understood that the metallic screen may have a different construction, exemplified by the examples described with reference to FIG. 1.

In another embodiment, the optical fibre sensor is wound directly above the metallic screen 26. In a still further embodiment, the optical fibre sensor 50 is embedded in the jacket 29.

In an embodiment, not shown in FIG. 2, the MV power cable is provided with a metallic armour external to and in contact with the metallic wires of the screen and separated therefrom by one or more protecting tapes. In an embodiment, the loosely or semi-loosely buffered optical fibre of the optical fibre sensor is embedded in a modified wire of the armour to be laid parallel to the armouring elements.

When the optical fibre is wound in a position radially external with respect to the metallic screen, as in cable configurations shown in FIGS. 1 and 2, the sensing optical fibre is advantageously wound in a direction opposite to that of the screen elements (wires or tapes), such that the angle φ between the winding direction 51' of the optical fibre and the winding direction 26' of the screen elements is larger than zero. Such a winding configuration is preferred also when the optical fibre is wound in a radial external position with respect to the metallic sheath, in the case a metallic screen is provided and is made of wires or tapes wound substantially in the same winding direction (as shown in FIG. 1). In a preferred embodiment, the angle φ is of 90°, namely the winding of the optical fibre is orthogonal to the winding of the screen wire or tape.

In a three-phase transmission system for high or medium voltage transmission, for each phase, a cable metallic layer external to the insulated conductor, for example the metallic sheath (if present) or, preferably, the metallic screen, is connected to earth at least at one point along the cable run to serve as an electrostatic shield that nullifies the electric field outside the cable. The metallic layer also drains the short-circuit current to earth under fault conditions. Earth connection of the metallic layer external to the insulated conductor is generally used both in AC and DC power cables.

In single-core cables carrying alternating current, the current flowing in the core conductor induces a voltage in the metallic screen. When the metallic screens of a three phase system are bonded one to another, the induced voltage causes an induced current to flow in the formed circuit. The most common configurations of screen bonding are single point, solid-bonded and cross-bonded.

In single-point systems, the metallic screens of the three cables are connected together at both ends of the transmission line and one end of the shields is earthed. A surge arrester may be connected to the other end for absorption of possible overvoltage. Although this configuration limits the current circulating in the shield, it can be effectively employed in systems having length up to 1 km.

In solid-bonded systems, the screens of the three phases are connected and grounded together at both ends of the line by ground conductors.

Cross-bonding is used for underground transmission systems longer than 1 km. In a cross-bonded system, the transmission line is divided into three approximately equal sections. The metallic screens of the phases are connected in couples at each cable section and grounded at both ends of the cable run by ground conductors. Pair connection of the screens takes place in link boxes for cross-bonding, which are grounded by ground conductors in order to have a return path at each section of the transmission line. Further details about solid-bonding and cross-bonding can be found in D. A. Tziouvaras, *"Protection of High-Voltage AC Cables"*, published at the Power Systems Conference, PSC, 2006 and downloaded from the Internet on 2014 Jan. 27, at https://www.selinc.com/WorkArea/DownloadAsset.aspx?id=3206.

Briefly, in a cross-bonding layout of a three-phase cable transmission system, three single-core cables carry electrical energy of each respective phase from a first end location to a second end location. Each cable is divided into three cable sections S1, S2 and S3 and at two cross-bonding locations and the metallic screens are electrically connected in pairs (the connection scheme is repeated along the cable as many times as necessary in dependence of the cable length). Metallic screens of each cable are grounded by ground conductors at the end locations of the transmission line, i.e. after three cable sections, and at the cross-bonding locations where link boxes with cable joints and terminations used for screen connection are grounded. Phenomena like lightning, switch-on maneuvers of the electric power distribution network, line-to-line ground faults, load rejection, ferroresonance, just to cite a few, can cause a voltage rise in the metallic screen to unacceptably high values. In order to protect the cables from detrimental over-voltages (surges), surge voltage limiters (SVLs) are used, particularly at the cross-bonding locations.

The continuous cable span of a cable section of the transmission line has a typical length of 800 m. The metallic screens are grounded every three cable spans so that the length of the transmission line is about 2.5 km (S1+S2+S3), but in some cases it can reach 5 km. Since the length of the sections of the line is not exactly the same for the three phases, due to the different positioning of the splice for each phase, for example with a variance of about 100 m, the current circulating in the metallic screens is different for each phase.

A current loss caused by a damage in the cable jacket may increase the imbalance between the induced currents in the different phases of the transmission system.

The operation voltage in HV transmission systems is normally of at least 35 kV and often exceeds a few hundreds of kV. The Applicant has observed that in a cross-bonding AC transmission system, the current circulating in the metallic screens can be of from about 10% to about 20% of the current circulating in the conductors. Differently, high and medium voltage power systems for direct current (DC) transmission do not suffer from current losses at the metallic shield.

The Applicant has noted that a localized current loss of only 100 A along the power transmission line is worth of attention because it indicates damage to the polymeric jacket protecting the cable from external threats and therefore a possible on-going degradation of the cable structure and performance. The Applicant has realized that longitudinal variations of the current carried by the power-carrying conductor(s) of the power cable can be efficiently detected and localised by measuring a single-mode optical fibre by polarisation-sensitive optical reflectometry, wherein the optical fibre is in contact with a cable structure and located radially external to a cable metallic layer external to the insulated conductor.

Figure 3:
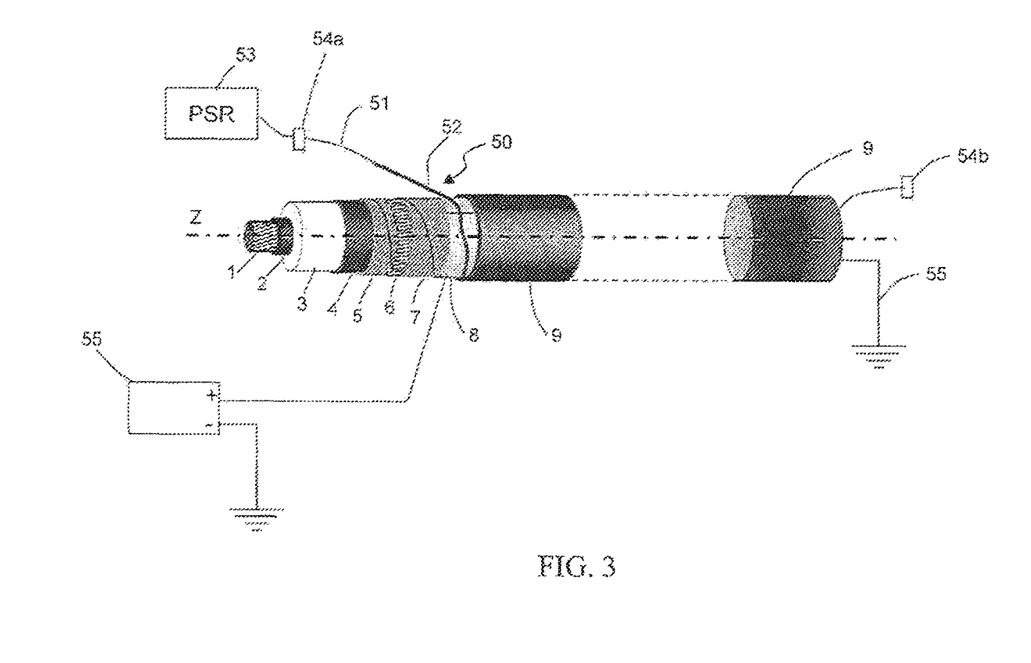
FIG. 3 shows diagrammatically a system for detecting a current loss in a single-core power cable, according to embodiments consistent with the present disclosure.

FIG. 3 shows diagrammatically a system for detecting a current loss in a power cable. The power cable can be a high or medium voltage cable of a single-phase system for DC or AC transmission. The cable structure is similar to that shown in FIG. 1. Same reference numerals as those of FIG. 1 indicate same or similar elements. In the cable of FIG. 3, a further separation tape 5 is provided between outer semiconductive layer 4 and metallic screen 6. The cable, and thus the conductor 1, extends along a main longitudinal axis Z for a length L. During operation, at an end of the cable, a metallic layer external to the insulated conductor, for example the metallic screen 6 or the metallic sheath 8, is connected to ground by a ground conductor 55. When a current leak occurs in correspondence of a damage causing an unwanted further electric connection to ground, for example in case a water path to earth is established following a wet-weather event, a current portion will propagate in the circuit section starting from the damage location. A drop in current intensity is determined by a decrease of the induced magnetic field. The sensing optical fibre is wound, in this case, onto the metallic shield 8 in such a way that the induced magnetic field has a component parallel to the direction of propagation of the light travelling in the fibre. The Faraday effect causes a rotation of the polarization state of the light, the rotation being proportional to the component of the magnetic field parallel to the propagation direction, and thus to the electrical current that causes the magnetic field. It follows that a variation (e.g. decrease) of the magnetic field component raising from a variation of current induces a variation in the angle of rotation of the polarisation plane of the light propagating in the fibre, at the position where the leak occurs. From the variation of the angle of Faraday rotation, the variation of the current can be calculated by means of Eq. (3).

During operation, current flows along the conductor of the cable. If the cable is part of a transmission line for a DC power transmission system, direct current flows in the conductor whereas no induced current circulates in the metallic shields. Since a damage in the cable jacket is detected from a local variation of the current flowing in the metallic shield, which is optically detected by measuring the Faraday rotation of the SOP of the light travelling along the sensing fibre, an electrical current needs to flow along the metallic shield during optical measurements. The Applicant has thus understood that in an operating DC system or in a system (DC or AC) that is not in operation, current needs to be supplied by an external source, such as by a voltage generator, in the cable metallic layer connected to ground.

In the embodiment shown in FIG. 3, it is assumed that optical measurements are performed when the cable is in an "OFF" state, i.e. the conductor 1 is not transmitting a load current, and that the metallic sheath 8 is connected to ground through ground conductor 55. Measurement for detection of a damage in the cable, which causes a current loss and thus a variation of the polarisation status of the light travelling along the fibre (i.e. a Faraday rotation), is carried out by: (1) optically connecting the sensing fibre 51 of the optical fibre sensor 50 to a polarisation-sensitive reflectometer 53, which is configured to generate optical signals with known input states of polarisation (SOPs); (2) electrically connecting the metallic sheath 8 to a direct current (DC) generator 55, in particular to a pole of the generator, whereas the other pole is grounded; (3) circulating a direct current into the metallic shield by switching on the generator; (4) injecting from the reflectometer 53 a probe optical signal having an input SOP into the sensing optical fibre 51, and (5) detecting a backscattered optical signal corresponding to the injected probe optical signal to measure the Faraday rotation and thus to determine a longitudinal variation of the current circulating in the metallic shield. It is to be understood that steps (1) to (3) can be performed in any order.

Preferably, to ease connection with the reflectometer and to other optical elements (as described more in detail in the following embodiments), such as an optical fibre of an adjacent power cable, the length of the sensing optical fibre is such that a fibre portion exits from each end of the cable. Preferably, the sensing optical fibre is connectorised at both ends to enable quick connection and disconnection, for example by connecting by fusion splicing both ends of the fibre with a respective optical pigtail 54a and 54b, for example an FC/APC Splice-On Connector produced by Fitel (Furukawa Electric).

Measurements of the variations of the Faraday rotation are carried out by means of polarization-sensitive optical time domain reflectometry (POTDR) or by polarization-sensitive optical frequency domain reflectometry (POFDR) while a direct current is injected in the metallic shield or screen of the cable.

Figure 4:
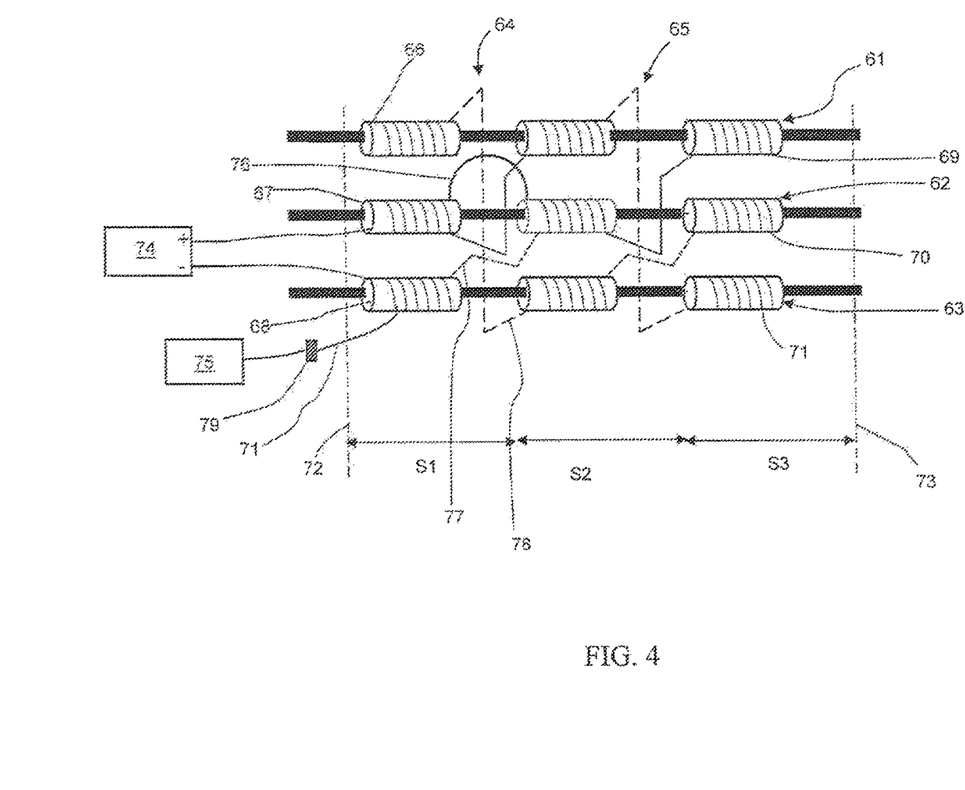
FIG. 4 shows diagrammatically a monitoring system for detecting current losses in a power transmission system with cross-bonding layout, according to an embodiment consistent with the present disclosure.

FIG. 4 shows diagrammatically a monitoring system for detecting current losses in a power transmission system with cross-bonding layout, according to an embodiment consistent with the present disclosure. The present configuration of the monitoring system can be used for measurements in switched-off AC power transmission systems. In the figure, the transmission system comprises three single-core cables, namely first, second and third cable 61, 62 and 63, which transmit electrical energy of each respective phase from a first end location 72 to a second end location 73. Each cable is divided into three longitudinal cable sections S1, S2 and S3, typically of about equal length. Cables 61, 62 and 63 are only schematically depicted, showing respective metallic screens 66, 67 and 68. To improve clarity, the external jacket of the cables is not shown.

In operation, at both end locations 72 and 73, each cable is grounded and at two cross-bonding locations 64 and 65 the metallic screens are cyclically electrically connected in pairs at grounded link boxes (not shown), possibly provided with SVLs. The individual cables may have a typical construction of a high-voltage cable, such as that of FIG. 1 or of a medium-voltage cable, such as that of FIG. 2. Each cable comprises a respective first, second and third metallic screen 66 to 68, each metallic screen being placed radially external to a respective insulated core (not shown). A respective first, second and third optical fibre sensors are wound radially external to the respective metallic screen, each sensor comprising a respective first, second and third optical fibre 69, 70 and 71.

To proceed with the detection of a longitudinal variation of an electric current in the power transmission system indicative of a mechanical damage of a cable of the system, all of the cables 61, 62 and 63 are disconnected from ground at both the first and second end locations 72 and 73. Preferably, in order to reduce the complexity of extra electrical connections in the transmission system, sections of one or more cables are checked independently. In some embodiments, sections of a cable of the system are monitored sequentially. At a first end location 72 of the transmission line, first and second metallic screens 67 and 68 of second and third cables 62 and 63, respectively, are connected to a DC voltage generator 74, i.e. to the two respective poles of the generator. Electric connection between the first and second metallic layer and the respective first and second pole of the generator can be made in a conventional way, for example by the connections typically present in the cross-bonding box. At the cross-bonding location 64, the longitudinal cable sections S1 and S2 of the second metallic screen 67 of the second cable 62 are connected one another, for example by means of wire connection 76, so that an electric circuit is formed between the two first sections of cables 67 and 68 due to transposition of the screen of the second section S2 of the second cable with the first section S1 of the third cable, indicated in the figure with cross-bonding electric connection 77. The first sections S1 of second and third cables are thus the transmission portion under test for current losses in the embodiment shown in FIG. 4. It is to be understood that other sections of the same or of a different cable of the transmission system can be similarly checked for current losses by forming an electric circuit of the sections of interest. For example, to monitor the first section S1 of the first cable 61 an electric circuit can be formed by connecting the first section S1 with the second section S2 of the third cable 68, for example by means of a wire connection, thanks to the cross-bonding connection 78 between section S of first cable and section S2 of the third cable. In this way, sections S1 of the first and of the third cable are checked.

Preferably, the DC source 74 is configured to produce at the output poles a current of intensity $I_{DC}$ of from 100 A to 700 A, more preferably of from 200 A to 400 A. By taking into account the typical electrical resistances of the metallic screen and sheaths of high- and medium-voltage transmission cables, preferred minimum value of current of 100 A can be generated by a voltage of not less than 100 V. In general, the minimum voltage of the injected current depends on the electrical resistivity of the metallic layer through which the current circulates.

When the DC source is switched on, a current $I_{DC}$ flows in the electric circuit formed by the first sections of the second and third metallic screens 67 and 68. A commercially available modular generator can be used as DC source, such as Quasar Q5000, sold by Plasmi Industriali S.r.l., with a voltage of 100 V, current can be increased in steps of 100 A from 100 A to 700 A.

Each optical fibre sensor extends longitudinally between the cable ends at the first and second locations 72 and 73. Advantageously, two end portions of the optical fibre of each sensor extend beyond the cable ends. In order to check sections independently, for each section of each cable the optical fibre extends beyond the section ends. Preferably, both ends of each sensing fibre for each section of the cable are terminated with an optical pigtail (only pigtail 79 exiting a cable end of S1 of the third cable 63 is illustrated) to ease connection with the reflectometer and/or other optical elements. After installation of the cables, the optical pigtails can be housed into mechanical splice boxes so to be available for measurements.

In the embodiment shown in the figure, a first end of the optical fibre 71 wound around the metallic screen of section S1 of third cable 63 is optically connected to a polarisation-sensitive reflectometer (PSR) 75, e.g. by means of pigtail 79. The reflectometer is configured to inject polarised light into the fibre and to read the backscattered light exiting the fibre from the same end, thus forming a back and forth optical path. Alternatively, a single polarisation-sensitive reflectometer can be used for reading a pair of optical fibres (associated to cables 61 and 62 or to cables 62 and 63 or to cables 61 and 63) with the proviso of optically connecting said optical fibres in pairs at the cross-bonding location 64 (said connection not being illustrated for clarity reasons). In this way an optical path along two cables is created. With reference to the embodiment shown in FIG. 4, the optical fibre 70 wound around the metallic screen 67 of the section S1 of second cable 62 can be monitored together with optical fibre 71 of the first section of the third cable 63 by optically connecting a second end of optical fibre 71, opposite to the first end connected to the reflectometer, to an end of the optical fibre 70 of section S1 of the second cable 62. In this case, the polarisation-sensitive reflectometer can be optically connected to either of the second and third fibre 70, 71. The optical path monitored by polarisation-sensitive reflectometry is formed by second and third fibres 70, 71 of the first section, S1, of respective second and third cable.

A reference optical measurement is taken by the PSR, with the DC generator switched off, in order to evaluate the optical fibre intrinsic birefringence or the birefringence induced by the winding layout around the cable and by temperature, that is the birefringence not induced by the magnetic field.

The DC current $I_{DC}$ injected by the DC generator into the circuit induces a magnetic field orthogonal to the direction of the current circulating in the metallic layers and having a constant intensity in time. If there is no damage in the cable polymeric jacket and no water penetration causing the electrical connection between the metallic screens to earth, the current circulating in the electrical circuit is approximately constant along the cable length. Current loss is efficiently measured by measuring the Faraday rotation angle $\theta$ to obtain the current intensity I according to Eqs. (1) and (2). If a current drop occurs along the electric circuit powered by the DC generator, a variation in the Faraday rotation is measured along the correspondent optical path and thus a drop in electric current is detected. Being the optical fibre sensor a distributed sensor, the position along the cable where the drop occurs is determined by analysing the backscattered optical signal to determine the position where the Faraday rotation is detected by the PSR. From the rotation angle $\theta$, the current trace vs. longitudinal position along the cable run is calculated and in the current trace, a decrease in current intensity localizes the longitudinal position of the leak. As apparent to the skilled person, the data collected by the PSR are sent and processed by a suitable data analyzer configured to analyse the detected backscattered optical signals to output a longitudinal distribution of the Faraday-induced birefringence, i.e. the Faraday angle per unit length, and to calculate the current distribution. In the usual ways, the analyser can be a processing unit which is part of the PSR 75 or logically connected to the PSR.

As it is generally known, to determine the equivalent birefringence vector and thus to calculate the Faraday rotation as a function of the optical path position, at least two measurements of the output SOP of the backscattered field, corresponding to two distinct input SOPs of the probe field, are performed. The detection of at least two backscattered signals, corresponding to two probe optical signals with different polarizations, allows the measurement of three degree of freedom necessary to define the rotation of the birefringence vector and thus the determination of the birefringence angle function, Eq. (3).

In the preferred embodiments, polarisation-sensitive reflectometry measurement to check for current leaks is carried out by injecting at least two probe optical signals having distinct states of polarisation (SOPs). With distinct SOPs it is meant that the Stokes vector representing, in the 3-dimensional Stokes space, a first SOP of a first signal is neither parallel nor anti-parallel to the Stokes vector representing a second SOP of a second signal.

In some embodiments, the root mean square (rms) value of a plurality of measurements of Faraday rotations is taken.

For transmission systems with different layout, such as single-point or solid-bonded systems phases which are not cross-bonded, the second and third metallic shields needs to be connected one to another at the opposite second end location in order to form an electric circuit with open ends electrically connected to a DC generator.

The method according to the present disclosure can be applied in DC transmission systems, for example in high- and medium-voltage electric power systems for long distance transmission. Although PSR measurements can be in principle carried out in an operating transmission system, as a safety precaution, it is preferred to perform the PSR measurements when the current is not circulating in the cable conductors. For example, PSR measurements are performed after installation of the cable and before operation of the system or during maintenance checks when the power is switched off.

Figure 5:
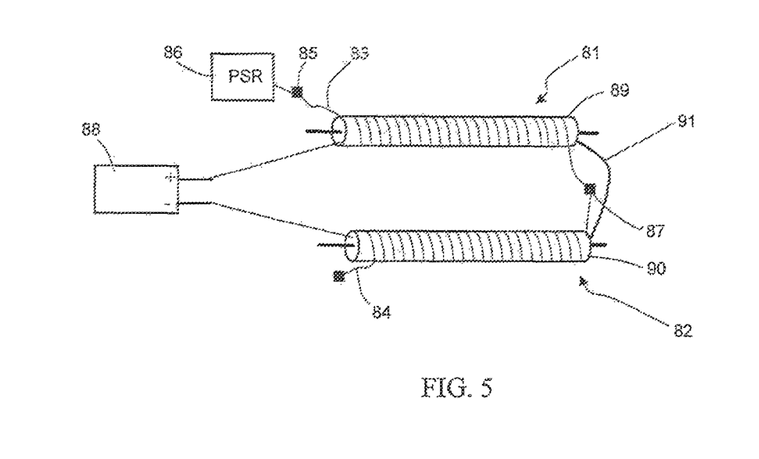
FIG. 5 shows diagrammatically a monitoring system for detecting current losses in a DC power transmission system, in an embodiment consistent with the present disclosure.

FIG. 5 shows diagrammatically a monitoring system for detecting current losses in a DC power transmission system. The DC power transmission system comprises a first power cable 81 and a second power cable 82. First and second power cables run from a first end location to a second end location. In operation, each cable is grounded at points, for example, 4 or 5 Km far. PSR measurements are carried out when the system is switched off, i.e. no power runs in the conductors of the cables. During PSR measurements, ground connections of the cables are disconnected. Cables 81 and 82 are single-core cables provided with a respective insulated conductor and a respective metallic layer 89 and 90, each being arranged radially external to the insulated conductor. For example, cables 81 and 82 are of the type shown in FIG. 1 or in FIG. 2. A respective optical fibre 83 and 84 is arranged radially external to each metallic layer and wound about the cable longitudinal axis. A DC generator 88 is electrically connected by means of its two poles to the first and second metallic layer 89 and 90 at the first end location of the system. An electrical circuit is for example at the second end location of the power system, by means of electric wire 91.

In order to form an optical loop, the first optical fibre 83 is connected to the second optical fibre 84 at one end location of the power system, preferably by an optical connector 87. A PSR measurement device 86 is optically connected to a free end of the first optical fibre 83 (or equivalently to a free end of the second optical fibre 84), by optical connector 85.

Figure 6:
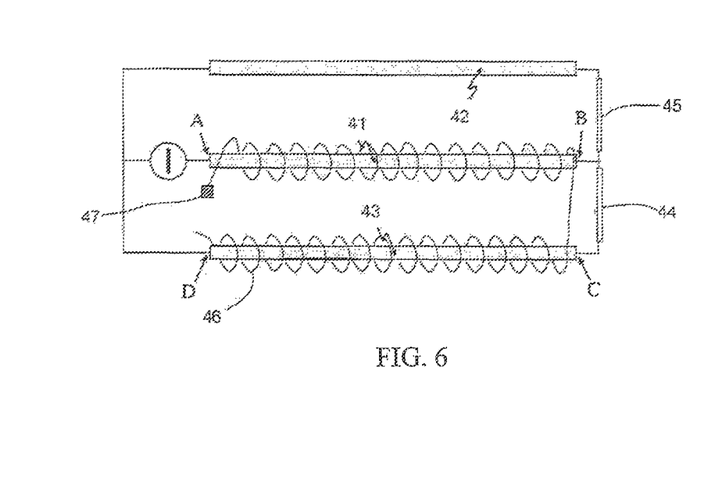
FIG. 6 schematically shows an electric circuit used for laboratory tests illustrated in the present disclosure.

Experimental tests were performed in the laboratory using an electric circuit schematically depicted in FIG. 6. An electric circuit 40 comprised three cables 41, 42 and 43, each comprising a respective conductor and having the same length, i.e. distance between end points A and B or between end points C and D, of 18.7 m. Cables were arranged parallel one to another and, at a first respective end, electrically connected one to another by electric wires 44 and 45. At a second respective end, the conductors of first and second cables 41 and 43 were connected to a direct current generator (not shown). Around the jackets of the first and second cables 41 and 43 an optical fibre sensor 46 was wound from point A to point D with a winding pitch of 10 cm. The optical sensor comprised a tube containing twelve optical fibres arranged in loose configuration.

The electric circuit has a balanced load and in cables 42 and 43 circulated half of the current flowing in cable 41. During the tests, the circuit was fed with direct current between 0 kA and 2.5 kA. Therefore, end point B of first cable 41, where current drops to half of its value, represents a position of discontinuity in the electric current.

With this configuration, $\cos \psi(z)$, from Eq. (3), is constant and equal to $2\pi R/L_s$, where R is the radius of the helicoidal winding of the fibre around the cable and $L_s$ is the length of a single winding (about 30.0 cm in the present case). From Eq. (3), the Faraday induced circular birefringence is given by $$\eta(z) = \frac{2\mu_0 VI}{L_s} \quad (4)$$

where V is the Verdet constant and I is the average current running in the conductor.

The polarization states of the backscattered optical signals in the optical fibre were measured by POFDR at point A. The reflectometer was an Optical Backscatter Reflectometer commercialised by Luna Technologies. In the input optical path, upstream the connection with an optical fibre of first sensor 46, the reflectometer was connected with a polarisation controller to allow variation of the input SOP of the probe optical signal.

The local intrinsic birefringence of the fibres of the sensor was measured at zero current, by using a technique described in previously cited L. Palmieri and A. Galtarossa, J. Lightw. Technol. 29 (2011) 3178-3184.

Figure 7:
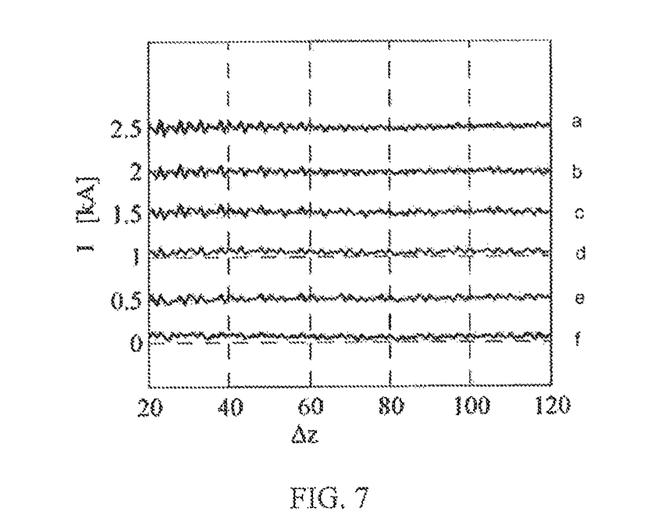
FIGS. 7 and 8 are to two graphs illustrating experimental results of current (kA) as a function of the number of windings, Δz, calculated from POFDR measurements on the electric circuit of FIG. 6.

FIG. 7 is a graph reporting the average current I, in kA, from POFDR at the first cable 41 as a function of the number of windings, $\Delta z$. Curves a to f correspond to injection of direct current with values 2.5, 2.0, 1.5, 1.0, 0.5, and 0 kA, respectively. Spatial resolution was of 8.4 cm. It was observed that the values calculated from optical measurements correspond to the nominal current values.

Figure 8:
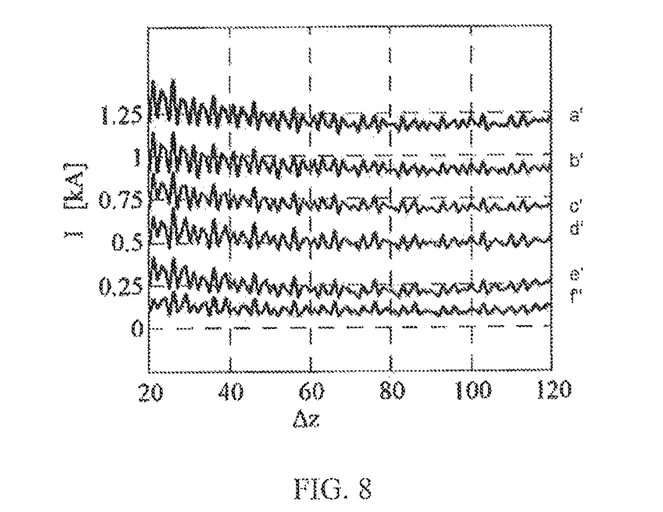

FIG. 8 is a graph reporting the average current, in kA, calculated from POFDR measurements at the second cable 43, in which a current I/2 circulates. Experimental results show that the halved current value was accurately measured. Accuracy was seen to depend on the value of the injected current: larger the injected current, the larger the accuracy. Tests suggested that currents larger than 250 A could be estimated with standard deviation of less than 100 A, which corresponded, for the pitch selected for the tests, to a length of electric cables larger than 10 meters.

The invention claimed is:

1. A method for detecting an electrical current longitudinal variation in a power transmission system comprising a power cable, comprising: providing a grounded power cable having a longitudinal axis, extending between first and second cable ends for a cable length, and comprising an insulated conductor, a metallic layer radially external to the insulated conductor, and an optical fibre sensor longitudinally extending at least between the cable ends, said optical fibre sensor comprising a single-mode optical fibre wound about the longitudinal axis in a radial external position with respect to the metallic layer; circulating an electric current in the metallic layer along the cable length to induce a magnetic field; injecting into a first end of the single-mode optical fibre a probe optical signal polarised in an input polarisation state; detecting a backscattered optical signal corresponding to the injected probe optical signal by polarisation-sensitive optical reflectometry; analysing the backscattered optical signal to determine a longitudinal evolution of a rotation angle of the polarisation state; calculating, from the longitudinal evolution of the rotation angle, a longitudinal variation in a magnetic field in the cable so as to determine a trace of electric current inducing said magnetic field as a function of the longitudinal position; and analysing the trace to detect a presence of a longitudinal variation in the electric current and the longitudinal position between the cable end at which the variation occurs.

2. The method of claim 1, wherein circulating an electric current in the metallic layer comprises providing an electric direct current in the metallic layer to induce a magnetic field therein.

3. The method of claim 2, wherein the direct current has an intensity value of from 100 A to 700 A.

4. The method of claim 2, wherein providing a direct current is carried out by electrically connecting a first pole of a DC generator to the cable metallic layer.

5. The method of claim 1, wherein the optical fibre of the sensor is wound about the longitudinal axis in a single winding direction.

6. The method of claim 1, wherein the optical fibre of the sensor is wound about the longitudinal axis with a constant pitch.

7. The method of claim 6, wherein the constant pitch is from 10 cm to 50 cm.

8. The method of claim 1, wherein the optical fibre is wound about the longitudinal cable axis so that a direction of propagation of a light travelling in the fibre is substantially in a direction of a non-null component of the magnetic field induced in the cable when the current circulates in the metallic layer.

9. The method of claim 1, wherein the cable is a high-voltage or a medium voltage cable and the metallic layer is a metallic screen.

10. The method of claim 1, wherein the cable is a single-core cable.

11. The method of claim 8, wherein the cable is a single-core cable.

12. The method of claim 1, wherein:
injecting into a first end of the single-mode optical fibre comprises injecting a plurality of probe optical signals having distinct input polarisation states; detecting a backscattered optical signal comprises detecting a corresponding plurality of backscattered optical signals; and analysing the backscattered optical signal comprises analysing a plurality of backscattered optical signals to determine a longitudinal evolution of the rotation angle of the polarisation state.

13. The method of claim 1, wherein the cable is a first cable of a three-phase transmission system in alternating current with a first metallic layer, the transmission system further comprising a second and a third power cable, each cable comprising an insulated core and a respective second and third metallic layer radially external to the insulated core, and further comprising:
forming an electric circuit by electrically connecting a first and a second metallic layer one to another at a respective first end and first and second metallic layer to a direct current generator at a respective second end opposite to the first end,
wherein circulating an electric current in the metallic layer comprises providing, by using the generator, an electric direct current in the first and second metallic layers to induce a magnetic field.

14. The method of claim 13, wherein the transmission system has a cross-bonding configuration having a first, second and third transmission line, each line being divided into three sections, and the metallic layers of the phases being connected in couples at each section and grounded at both ends of each transmission line, wherein the first cable is a section of the first transmission line, and the second cable is a section of the second transmission line.

15. The method of claim 13, comprising disconnecting ground conductors from earth before circulating the electric current in the metallic layer along a cable length to induce a magnetic field.

* * * * *